United States Patent
You et al.

(10) Patent No.: US 12,408,319 B2
(45) Date of Patent: Sep. 2, 2025

(54) SEMICONDUCTOR STRUCTURE INCLUDING BIT LINES AND FABRICATION METHOD THEREOF

(71) Applicant: CHANGXIN MEMORY TECHNOLOGIES, INC., Hefei (CN)

(72) Inventors: Kang You, Hefei (CN); Tangyu Pan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 519 days.

(21) Appl. No.: 17/952,256

(22) Filed: Sep. 25, 2022

(65) Prior Publication Data

US 2024/0049444 A1    Feb. 8, 2024

(30) Foreign Application Priority Data

Aug. 2, 2022  (CN) .......................... 202210925007.9

(51) Int. Cl.
  *H10B 12/00*    (2023.01)
  *H01L 21/311*    (2006.01)
  (Continued)

(52) U.S. Cl.
  CPC ........ *H10B 12/09* (2023.02); *H01L 21/31116* (2013.01); *H01L 21/76831* (2013.01);
  (Continued)

(58) Field of Classification Search
  CPC .... H10B 12/09; H10B 12/482; H10B 12/053; H10B 12/315; H01L 21/31116;
  (Continued)

(56) References Cited

U.S. PATENT DOCUMENTS

2008/0166866 A1 * 7/2008 Ren ................... H01L 21/76897
                                                  257/E21.507
2008/0286891 A1 * 11/2008 Suzawa ............. H01L 21/28114
                                                  257/E23.152
(Continued)

FOREIGN PATENT DOCUMENTS

CN      103151256 A    *   6/2013
CN      110690112 A    *   1/2020    ............. H01L 21/31
(Continued)

*Primary Examiner* — Eva Y Montalvo
*Assistant Examiner* — Jiyoung Oh
(74) *Attorney, Agent, or Firm* — Kilpatrick Townsend & Stockton LLP

(57) ABSTRACT

The method includes: providing a substrate; forming bit lines arranged at intervals along a first direction on the substrate, a width of a top of each bit line being greater than a width of a bottom of each bit line; forming an initial isolation spacer covering each bit line, the initial isolation spacer including a first initial isolation layer, a second isolation layer and a third initial isolation layer stacked, where the first initial isolation layer covers the bit lines, the second isolation layer is positioned between the first initial isolation layer and the third initial isolation layer, and a top surface of the second isolation layer is lower than a top surface of the first initial isolation layer; and removing the initial isolation spacer positioned on the substrate between adjacent bit lines, where a retained part of the initial isolation spacer constitutes an isolation spacer.

12 Claims, 7 Drawing Sheets

(51) Int. Cl.
*H01L 21/768* (2006.01)
*H10D 84/01* (2025.01)
*H10D 84/03* (2025.01)

(52) U.S. Cl.
CPC ....... *H10B 12/482* (2023.02); *H10D 84/0147* (2025.01); *H10D 84/038* (2025.01)

(58) Field of Classification Search
CPC ........... H01L 21/76831; H01L 21/8238; H01L 21/768; H01L 21/313; H10D 84/0147; H10D 84/038
USPC ........................................................ 257/296
See application file for complete search history.

(56) References Cited

U.S. PATENT DOCUMENTS

| | | | |
|---|---|---|---|
| 2014/0077333 A1* | 3/2014 | Son | H10B 12/0335 438/421 |
| 2015/0262625 A1* | 9/2015 | Han | H10B 12/482 257/773 |
| 2019/0088739 A1 | 3/2019 | Lee et al. | |
| 2022/0028997 A1* | 1/2022 | Lu | H10D 84/0147 |
| 2022/0068937 A1* | 3/2022 | Ping | H01L 21/76877 |
| 2022/0223603 A1* | 7/2022 | Ping | H10B 12/30 |

FOREIGN PATENT DOCUMENTS

| | | |
|---|---|---|
| CN | 113903737 A | 1/2022 |
| KR | 1020140086648 A | 7/2014 |

* cited by examiner

SEMICONDUCTOR STRUCTURE INCLUDING BIT LINES AND FABRICATION METHOD THEREOF

CROSS-REFERENCE TO RELATED APPLICATION

This application claims priority to Chinese Patent Application No. 202210925007.9, titled "SEMICONDUCTOR STRUCTURE AND FABRICATION METHOD THEREOF" and filed to the State Patent Intellectual Property Office on Aug. 2, 2022, the entire contents of which are incorporated herein by reference.

TECHNICAL FIELD

Embodiments of the present disclosure relate to the field of semiconductor technology, and more particularly, to a semiconductor structure and a fabrication method thereof.

BACKGROUND

As a semiconductor memory that randomly writes and reads data at a high speed, a dynamic random access memory (DRAM) is widely used in data storage devices or apparatuses. The DRAM generally includes a plurality of repeating memory cells, where each of the memory cells includes one transistor and one capacitor. A gate of the transistor is connected to a word line, a drain of the transistor is connected to a bit line, and a source of the transistor is connected to a capacitor structure. A voltage signal of the word line can control turning on or off the transistor, such that data information stored in the capacitor structure is read by means of the bit line, or the data information is written, by means of the bit line, into the capacitor structure for storage. To achieve insulation between adjacent bit lines, the outside of each of the bit lines is wrapped with an isolation spacer.

The DRAM also includes a capacitor contact structure between the adjacent bit lines. One end of the capacitor contact structure is connected to the source or the drain of the transistor, and the other end of the capacitor contact structure is connected to the capacitor, to achieve an electric connection between the capacitor and the source or the drain.

However, the isolation spacer is easily damaged when the capacitor contact structure is formed, which reduces yield of a semiconductor structure.

SUMMARY

In view of the above problems, embodiments of the present disclosure provide a semiconductor structure and a fabrication method thereof, which can avoid causing damage to an isolation spacer and improve yield of the semiconductor structure.

A first aspect of the embodiments of the present disclosure provides a method for fabricating the semiconductor structure, which includes: providing a substrate; forming a plurality of bit lines arranged at intervals along a first direction on the substrate, where a width of a top of each of the plurality of bit lines is greater than a width of a bottom of each of the plurality of bit lines; forming an initial isolation spacer covering each of the plurality of bit lines, where the initial isolation spacer comprises a first initial isolation layer, a second isolation layer and a third initial isolation layer stacked, the first initial isolation layer covers the plurality of bit lines, the second isolation layer is positioned between the first initial isolation layer and the third initial isolation layer, and a top surface of the second isolation layer is lower than a top surface of the first initial isolation layer; and removing the initial isolation spacer positioned on the substrate between adjacent two of the plurality of bit lines, where a retained part of the initial isolation spacer constitutes an isolation spacer.

A second aspect of the embodiments of the present disclosure provides a semiconductor structure, which is fabricated by means of the method for fabricating the semiconductor structure according to the first aspect. The semiconductor structure includes: a substrate; a plurality of bit lines, where the plurality of bit lines are arranged at intervals along the first direction, and a width of a top of each of the plurality of bit lines is greater than a width of a bottom of each of the plurality of bit lines, such that each of the plurality of bit lines has a first stepped surface; and an isolation spacer covering each of the plurality of bit lines, where the isolation spacer comprises a first isolation layer, a second isolation layer and a third isolation layer stacked, the first isolation layer covers the plurality of bit lines, the second isolation layer is positioned between the first isolation layer and the third isolation layer, and a top surface of the second isolation layer is lower than a top surface of the first isolation layer.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
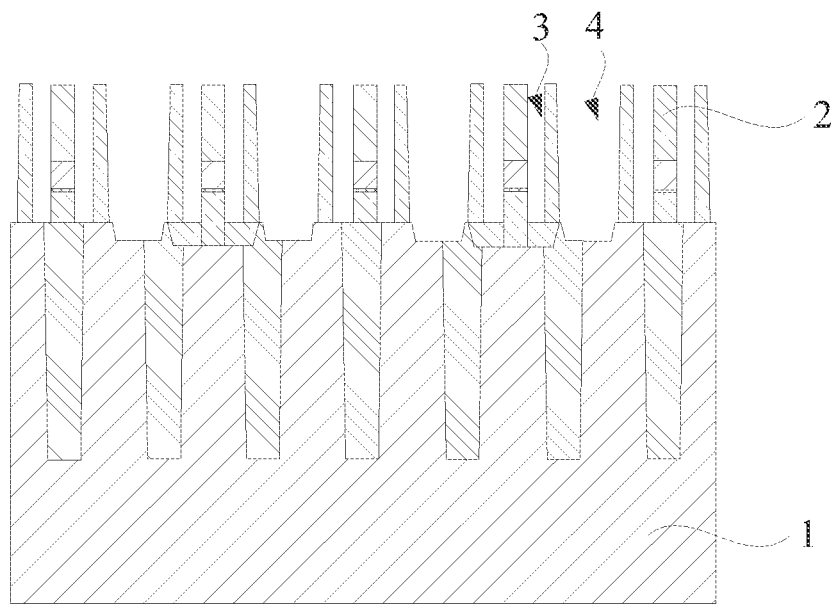
FIG. 1 is a schematic diagram of a semiconductor structure with capacitor contact holes provided by the related art.

Reference numerals in the accompanying drawings:
1: substrate; 2: bit line; 3: void; 4: capacitor contact hole; 5: conductive material;
10: substrate;
20: initial bit line; 21: initial bit line conductive layer; 211: initial contact layer; 212: initial barrier layer; 213: initial conductive layer; 214: intermediate barrier layer; 215: intermediate conductive layer; 22: bit line insulating layer;
30: intermediate bit line; 40: bit line; 41: bit line conductive layer; 411: contact layer; 412: barrier layer; 413: conductive layer;
50: initial isolation spacer; 51: first initial isolation layer; 52: second initial isolation layer; 53: third initial isolation layer;
60: isolation spacer; 61: first isolation layer; 62: second isolation layer; 63: third isolation layer; and
70: first stepped surface; 80: second stepped surface; and 90: capacitor contact structure.

DETAILED DESCRIPTION

Figure 2:
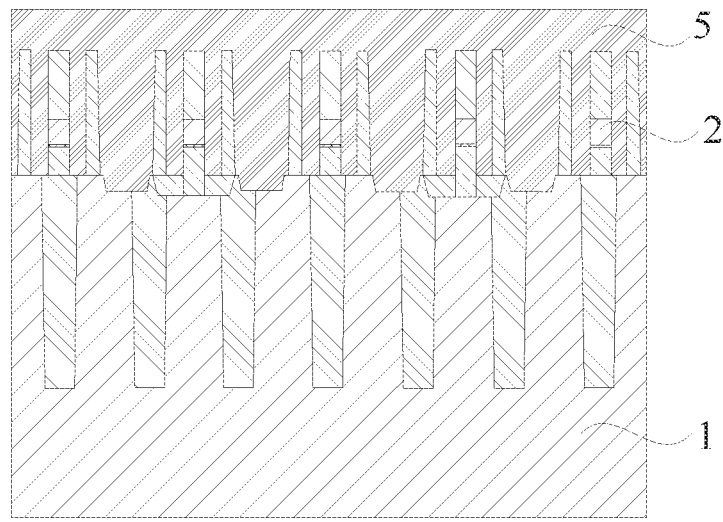
FIG. 2 is a schematic diagram of the semiconductor structure with a conductive material provided by the related art.

In the related art, a semiconductor structure has a problem of low yield. It is found after research that a reason for this problem is that, referring to FIG. 1 and FIG. 2, an isolation spacer generally includes a silicon nitride layer, a silicon oxide layer and a silicon nitride layer stacked, which is referred to as a NON structure. When the initial isolation spacer positioned on the substrate 1 between adjacent bit lines 2 is removed to form a capacitor contact hole 4, the silicon oxide layer is easily removed, such that voids 3 are formed in the isolation spacer. In the subsequent formation of a capacitor contact structure, a conductive material 5 of the capacitor contact structure is deposited into the voids 3. As a result, an isolation function of the isolation spacer may be reduced, and a parasitic capacitance formed between the bit line 2 and the conductive material in the isolation spacer may be increased, so yield of the semiconductor structure may be reduced.

For the above technical problem, embodiments of the present disclosure provide a semiconductor structure and a fabrication method thereof. A top surface of a second isolation layer is lower than a top surface of a first initial isolation layer and a top surface of a third initial isolation layer, so the top surface of the second isolation layer is not exposed. Thus, when an initial isolation spacer positioned on the substrate between the adjacent bit lines is subsequently removed, the second isolation layer positioned on side walls of the bit lines is not etched, and thus no void is formed in the isolation spacer, such that the yield of the semiconductor structure can be improved.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

This embodiment does not impose restrictions on the semiconductor structure, and an introduction will be made below by taking an example where the semiconductor structure is a dynamic random access memory (DRAM), but this embodiment is not limited thereto, and the semiconductor structure in this embodiment may be other structures.

Figure 3:
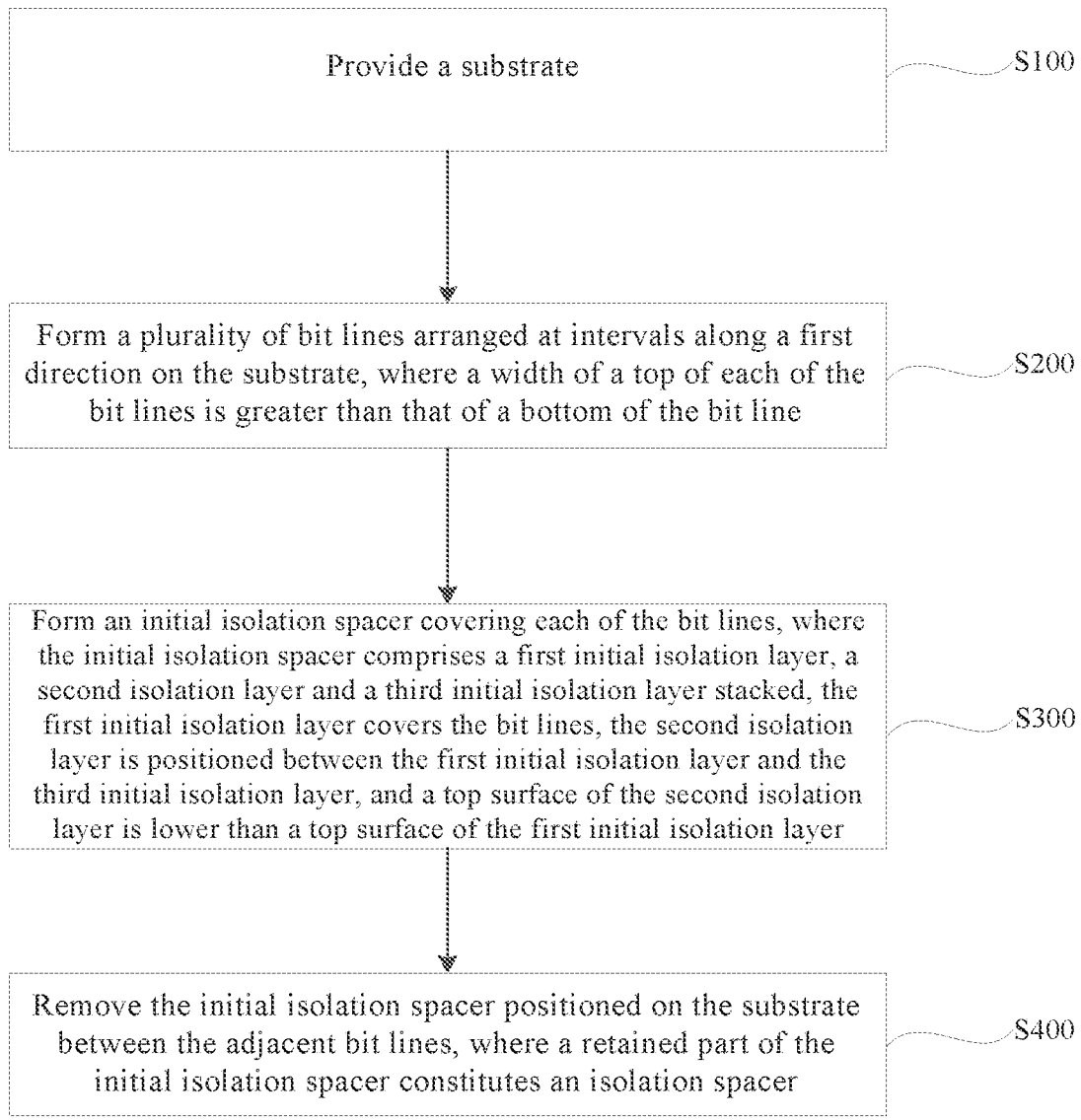
FIG. 3 is a process flow diagram of a method for fabricating the semiconductor structure according to an embodiment of the present disclosure.

As shown in FIG. 3, the method for fabricating the semiconductor structure provided by the embodiments of the present disclosure includes following steps.

Step S100: providing a substrate.

Figure 4:
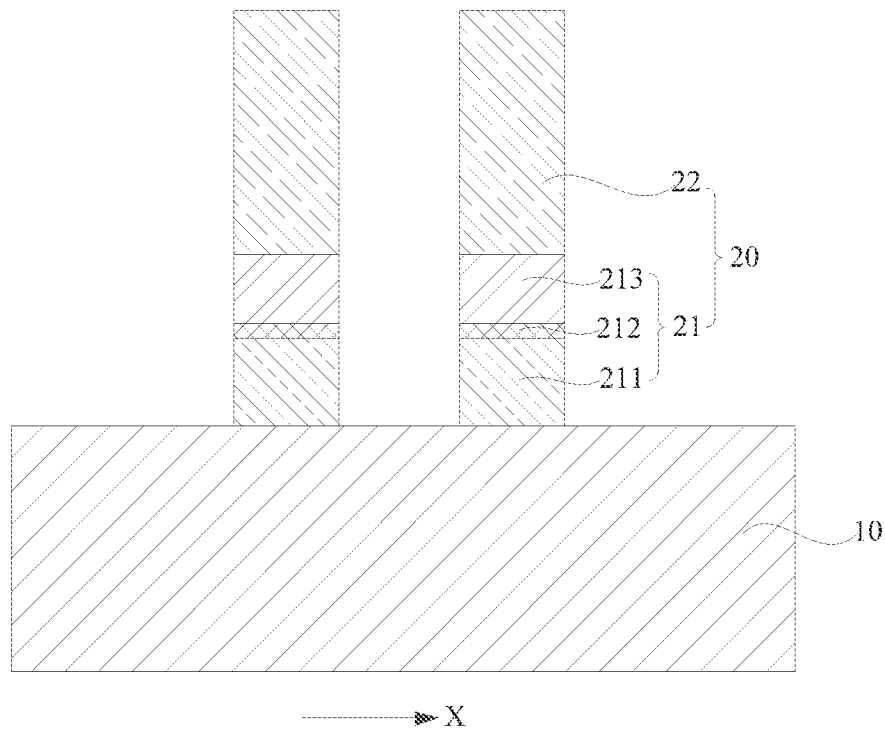
FIG. 4 is a schematic diagram of forming an initial bit line in the method for fabricating the semiconductor structure according to an embodiment of the present disclosure.

Referring to FIG. 4, the substrate 10 is configured to support a semiconductor device disposed thereon. The substrate 10 may be a silicon (Si) substrate, a germanium (Ge) substrate, a silicon germanium (GeSi) substrate, a silicon carbide (SiC) substrate, a silicon on insulator (SOI) substrate or a germanium on insulator (GOI) substrate, etc.

It should be noted that, the substrate 10 is internally provided with a plurality of active areas, a shallow trench isolation (STI) structure may be arranged between the plurality of active areas, and the plurality of active areas are separated by the STI structure to ensure that the plurality of active areas are independent of each other. For example, a shallow trench is formed in the substrate by means of a patterning fabrication process, and an insulating material is filled into the shallow trench to define, on the substrate, the plurality of active areas separated by the STI structure. The patterning fabrication process may be a self-aligned double patterning (SADP) process or a self-aligned quadruple patterning (SAQP) process. The insulating material may include silicon oxide, but is not limited thereto.

Step S200: forming a plurality of bit lines arranged at intervals along a first direction on the substrate, where a width of a top of each of the plurality of bit lines is greater than a width of a bottom of each of the plurality of bit lines.

For example, referring to FIG. 4, a plurality of initial bit lines 20 arranged at intervals along the first direction are formed on the substrate 10, and each initial bit line 20 includes an initial bit line conductive layer 21 and a bit line insulating layer 22 stacked in sequence. layer 22. In the first direction, the width of the bit line insulating layer 22 is equal to that of the initial bit line conductive layer 21. The first direction may be an X direction in FIG. 4.

In a possible embodiment, each film layer for forming the initial bit line 20 may be deposited on the substrate first, and then part of each film layer may be removed by means of the patterning fabrication process to form the initial bit line 20. The width of the initial bit line 20 is substantially equal from top to bottom, such that a longitudinal section of the initial bit line 20 is rectangular. In this way, difficulty of the patterning fabrication process may be simplified to facilitate the fabrication of the initial bit line 20.

The initial bit line conductive layer 21 may have a stacked structure. For example, the initial bit line conductive layer 21 includes an initial contact layer 211, an initial barrier layer 212 and an initial conductive layer 213 that are stacked in sequence, where a portion of the initial contact layer 211 may be disposed in the substrate 10 to facilitate electrical connection between active areas of the substrate 10. A material of the initial contact layer 211 includes polysilicon, but is not limited thereto.

It should be noted that, for the convenience of describing the structure of the initial bit line 20, FIG. 4 simplifies the semiconductor structure, and only illustrates the initial contact layer 211 on the substrate 10.

The initial barrier layer 212 is disposed on the initial contact layer 211. The initial barrier layer 212 has both conductive properties and barrier properties. For example, the initial barrier layer 212 may prevent metal conductive material in the initial conductive layer 213 from diffusing to the initial contact layer 211 and the substrate 10, thereby ensuring the insulation between the initial bit line 20 and the subsequent capacitor contact structure. A material of the initial barrier layer includes titanium nitride, but is not limited thereto.

The initial conductive layer 213 is disposed on the initial barrier layer 212, and a material of the initial conductive layer 213 includes tungsten. Tungsten has better electrical conductivity and thus can improve the conductive properties of the initial bit line 20.

Figure 5:
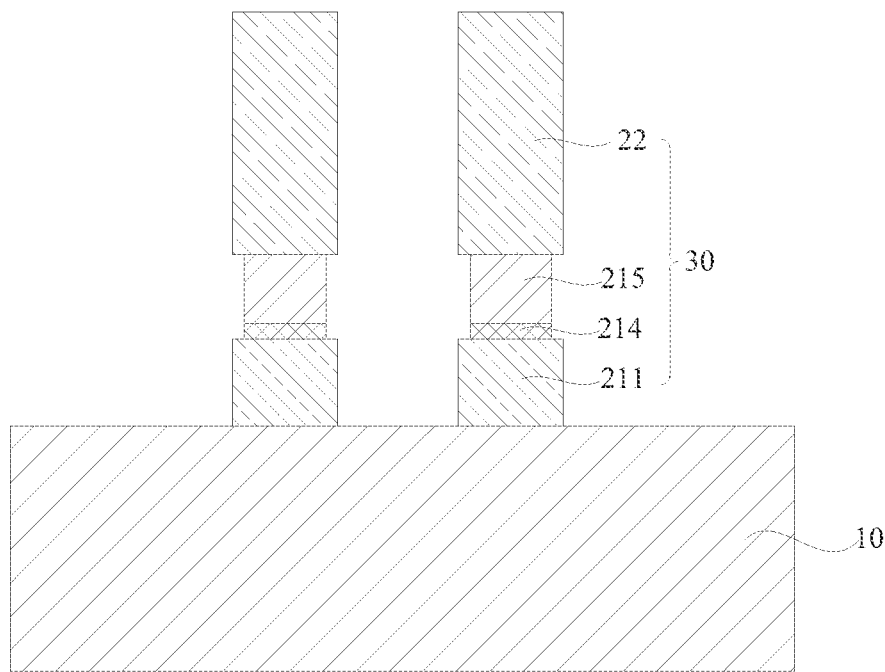
FIG. 5 is a schematic diagram of forming an intermediate bit line in the method for fabricating the semiconductor structure according to an embodiment of the present disclosure.
Figure 6:
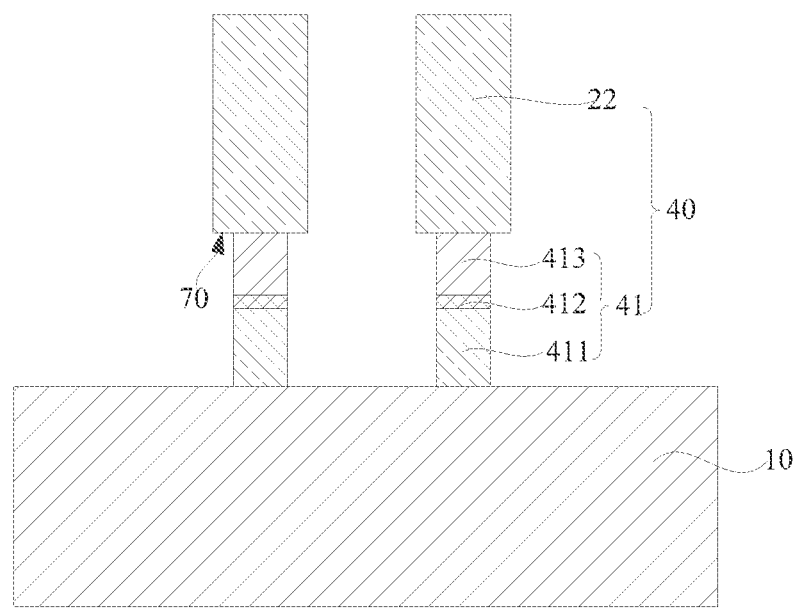
FIG. 6 is a schematic diagram of forming a bit line in the method for fabricating the semiconductor structure according to an embodiment of the present disclosure.

After the initial bit line is formed, referring to FIG. 5 and FIG. 6, the initial bit line conductive layer 21 is removed by part of the width along the first direction, where a remaining part of the initial bit line conductive layer 21 constitutes a bit line conductive layer 41, and a first stepped surface 70 is formed between the bit line conductive layer 41 and the bit line insulating layer 22.

In this embodiment, the initial bit line conductive layer 21 may be removed by part of the width by means of an etching process, such that a bit line 40 formed has a structure wider at the top and narrower at the bottom. In this way, the second isolation layer may be subsequently formed in a region defined by the first stepped surface 70 and the bit line conductive layer 41 to prevent the top surface of the second isolation layer from being flush with the top surface of the bit line 40. When the initial isolation spacer positioned on the substrate 10 between adjacent bit lines 40 is subsequently removed, the second isolation layer positioned on the side walls of the bit lines 40 is not etched, and thus no void is formed in the isolation spacer, such that the yield of the semiconductor structure can be improved.

An etching process may be one-time etching, or may be multiple etching. The one-time etching may refer to one-step etching, that is, the initial bit line conductive layer 21 is etched to a preset width by means of the one-time etching process. The multiple etching may refer to multi-step etching or step-by-step etching, that is, the initial bit line conductive layer 21 is etched to the preset width by means of at least twice etching processes, and types and/or process parameters of the at least twice etching processes are the same or different.

In a possible example, the initial bit line conductive layer 21 is directly etched to an initial width by means of the one-time etching process. In this way, the etching process is simple, and there is no need to add additional steps or adjust the process parameters.

In some other possible examples, the initial bit line conductive layer 21 is etched to the initial width by means of the twice etching processes. In this way, it may be ensured that the initial conductive layer is etched to the initial width more accurately, and thus over-etching to the initial conductive layer may be reduced or avoided.

For example, referring to FIG. 5, the initial conductive layer 213 and the initial barrier layer 212 are removed by part of a width along the first direction by means of a first etching process, to form an intermediate conductive layer 215 and an intermediate barrier layer 214 stacked. For the convenience of describing the formation process of the bit line, a structure obtained in this step may be referred to as an intermediate bit line 30.

In this embodiment, the intermediate bit line 30 formed by means of the first etching process has equal width at the top and the bottom and is narrower in the middle. That is, the width of the intermediate conductive layer 215 is less than that of the bit line insulating layer 22, and is also less than that of the initial contact layer 211.

Next, still referring to FIG. 6, the intermediate conductive layer 215, the intermediate barrier layer 214 and the initial contact layer 211 are removed by part of the width along the first direction by means of a second etching process, a retained part of the intermediate conductive layer 215 constitutes a conductive layer 413, a retained part of the intermediate barrier layer 214 constitutes a barrier layer 412, and a retained part of the initial contact layer 211 constitutes a contact layer 411. In this way, the contact layer 411, the barrier layer 412, the conductive layer 413 and the bit line insulating layer 22 stacked in the same vertical direction constitute one bit line 40. The width of the bit line conductive layer 41 in the bit line 40 is less than that of the bit line insulating layer 22, and the width of the bit line conductive layer 41 is 2 nm to 10 nm. Such a setting can enable the first stepped surface 70 to be formed in the bit line 40, and can also prevent the width of the initial bit line conductive layer from being excessively reduced, thereby ensuring conductive properties of the bit line 40.

In this step, the width of the intermediate conductive layer 215 removed is equal to the width of the intermediate barrier layer 214 removed, and is less than the width of the initial contact layer 211 removed. Based on such setting, it is convenient to reasonably adjust parameters in the first etching process and the second etching process according to different materials of film layers in the initial bit line conductive layer 21, to precisely control the width of each film layer removed in the initial bit line conductive layer 21, and reduce or avoid over-etching to the initial bit line conductive layer 21 as much as possible, thereby improving the yield of the bit line 40 and improving the yield of the semiconductor structure.

In this example, the first etching process and the second etching process may be the same or may be different.

In a possible embodiment, the first etching process and the second etching process may both be dry etching or wet etching. In this way, the etching process of the initial bit line conductive layer 21 can be simplified.

For example, the first etching process and the second etching process are both dry etching, and the process parameters of the first etching process and the process parameters of the second etching process are different. In this way, the width of each film layer removed in the initial bit line conductive layer 21 may be adjusted more reasonably.

In some embodiments, an etching gas of the first etching process may include a combination of chlorine gas ($Cl_2$) and carbon tetrafluoride ($CF_4$). A ratio of chlorine gas ($Cl_2$) to carbon tetrafluoride ($CF_4$) is 1:2 to 1:4. In this way, etching selectivity of each film layer in the initial bit line conductive layer 21 may be adjusted. For example, the etching selectivity of the first etching process to the initial conductive layer 213 and the initial barrier layer 212 is equal to 1, which may minimize difference between the width of the initial conductive layer 213 etched and the width of the initial barrier layer 212 etched. Meanwhile, the etching selectivity of the first etching process to the initial conductive layer 213 and the initial contact layer 211 is greater than 1, such that when removing, by part of the width, the initial conductive layer 213 and the initial barrier layer 212 simultaneously, the initial contact layer 211 is not etched, to facilitate forming the intermediate bit line 30, which has equal width at the top and the bottom and is narrower in the middle.

A volume flow rate of the chlorine gas ($Cl_2$) in the first etching process is 25 sccm to 35 sccm, and a volume flow rate of the carbon tetrafluoride ($CF_4$) is 90 sccm to 110 sccm. In some embodiments, the volume flow rate of the chlorine gas ($Cl_2$) is 30 sccm, and the volume flow rate of the carbon tetrafluoride ($CF_4$) is 100 sccm. Etching time of the first etching process is 10 s to 30 s. In some embodiments, the etching time of the first etching process is 20 s. Based on such setting, it may be ensured that the formed intermediate bit line 30 has equal width at the top and the bottom and is narrower in the middle.

The bias voltage of the first etching process is 0 V. Based on such setting, the etching gas may remove, only along the first direction, the initial conductive layer 213 and the initial barrier layer 212 by part of the width, to reduce or even avoid causing damage to the substrate 10 or the bit line insulating layer 22 along the vertical direction, thereby improving the yield of the semiconductor structure.

The etching gas of the second etching process may include chlorine gas ($Cl_2$) and nitrogen trifluoride ($NF_3$), and a ratio of the chlorine gas ($Cl_2$) to the nitrogen trifluoride ($NF_3$) is 3:1 to 1:1. Based on such setting, the etching selectivity of the etching gas to the intermediate conductive layer 215, the intermediate barrier layer 214 and the initial contact layer 211 may be adjusted, such that the width of the initial contact layer 211 etched is greater than the width of the intermediate conductive layer 215 etched and the width of the intermediate barrier layer 214 etched. In this way, the bit line 40 formed is wider at the top and narrower at the bottom. For example, the etching selectivity of the second etching process to the intermediate conductive layer 215 and the intermediate barrier layer 214 is equal to 1, which can minimize the difference between the width of the intermediate conductive layer 215 etched and the width of the intermediate barrier layer 214 etched. Meanwhile, the etching selectivity of the second etching process to the intermediate conductive layer 215 and the initial contact layer 211 is less than 1, such that the width of the initial contact layer 211 etched is greater than the width of the intermediate conductive layer 215 etched and the width of the intermediate barrier layer 214 etched. Within a certain period of time, a remaining width of the intermediate conductive layer 215, a remaining width of the intermediate barrier layer 214, and a remaining width of the initial contact layer 211 are consistent.

The volume flow rate of chlorine gas ($Cl_2$) in the second etching process is 15 sccm to 25 sccm, and the volume flow rate of nitrogen trifluoride ($NF_3$) is 5 sccm to 15 sccm. In some embodiments, the volume flow rate of chlorine gas ($Cl_2$) is 20 sccm, and the volume flow rate of nitrogen trifluoride ($NF_3$) is 10 sccm. The etching time of the second etching process is 10 s to 20 s, In some embodiments, the etching time of the second etching process is 15 s. Based on such setting, it may be ensured that the formed bit line 40 is wider at the top and narrower at the bottom.

The bias voltage of the second etching process is 0 V Based on such setting, the etching gas of the second etching process may remove, only along the first direction, the intermediate conductive layer 215, the intermediate barrier layer 214 and the initial contact layer 211 by part of the width, such that no damage is caused to the substrate 10 or the bit line insulating layer 22 along the vertical direction, and thus the yield of the semiconductor structure is improved.

It should be noted that the first etching process and the second etching process may also be different. For example, the first etching process is dry etching, and the second etching process is wet etching; or the first etching process is the wet etching, and the second etching process is the dry etching. Based on such setting, better consistency of the dry etching may be utilized to improve accuracy of a pattern, and also better etching selectivity of the wet etching may be utilized. When etching the initial bit line conductive layer 21, it may be avoided causing damage to the exposed substrate 10 and the bit line insulating layer 22. That is, the damage to the substrate 10 and the bit line insulating layer 22 is smaller, and the damage to semiconductor devices (e.g., word lines) in the substrate 10 may be reduced, thereby ensuring performance of the semiconductor structure. Furthermore, the damage to the bit line insulating layer 22 may also be reduced, insulation properties of the bit lines and other semiconductor devices (such as capacitor contact structures) formed subsequently can be improved, and the yield of the semiconductor structure can be improved.

Step S300: forming an initial isolation spacer covering each of the bit lines, where the initial isolation spacer comprises a first initial isolation layer, a second isolation layer and a third initial isolation layer stacked, the first initial isolation layer covers the bit lines, the second isolation layer is positioned between the first initial isolation layer and the third initial isolation layer, and a top surface of the second isolation layer is lower than a top surface of the first initial isolation layer.

In an example, the top surface of the second isolation layer 62 may be positioned between the top surface of the first initial isolation layer 51 and the first stepped surface 70. In yet another example, the top surface of the second isolation layer 62 may be flush with the first stepped surface 70. In still another example, the top surface of the second isolation layer 62 is lower than the first stepped surface 70. That is, the top surface of the second isolation layer 62 is positioned between the first stepped surface 70 and the substrate 10.

Figure 7:
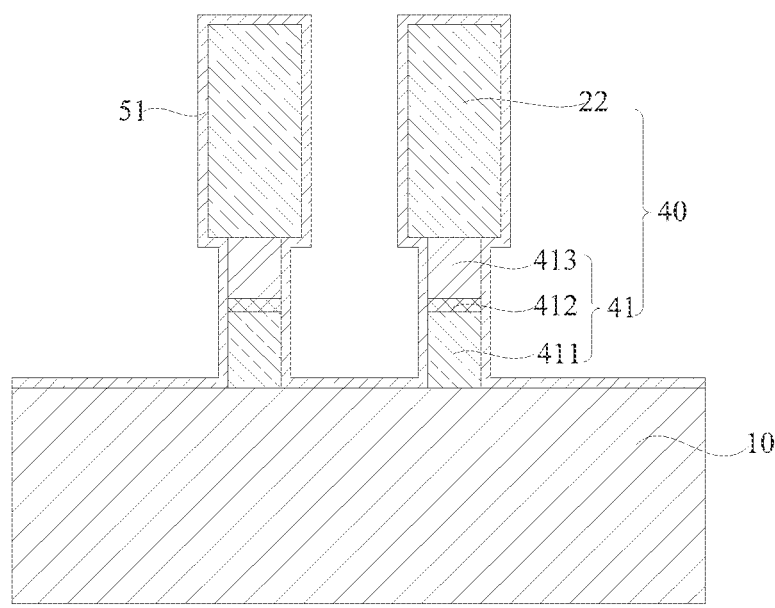
FIG. 7 is a schematic diagram of forming a first initial isolation layer in the method for fabricating the semiconductor structure according to an embodiment of the present disclosure.

For example, referring to FIG. 7, the first initial isolation layer 51 is formed by means of an atomic layer deposition process, the first initial isolation layer 51 is wrapped on the bit lines 40 and covers the substrate 10 between adjacent bit lines 40, where the first initial isolation layer 51 forms a second stepped surface 80 on the first stepped surface 70. A material of the first initial isolation layer 51 is the same as that of the bit line insulating layer 22, both including silicon nitride.

Figure 8:
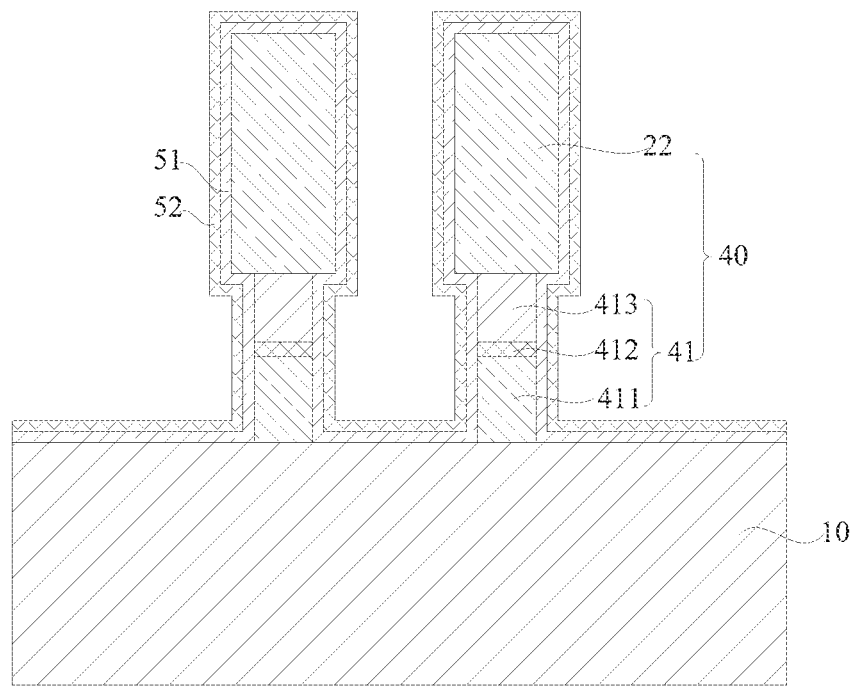
FIG. 8 is a schematic diagram of forming a second initial isolation layer in the method for fabricating the semiconductor structure according to an embodiment of the present disclosure.

Next, referring to FIG. 8, the second initial isolation layer 52 is formed by means of the atomic layer deposition process, the second initial isolation layer 52 is covered on the first initial isolation layer 51. That is, the second initial isolation layer 52 is conformally covered on the first initial isolation layer 51. A material of the second initial isolation layer 52 includes silicon oxide.

Figure 9:
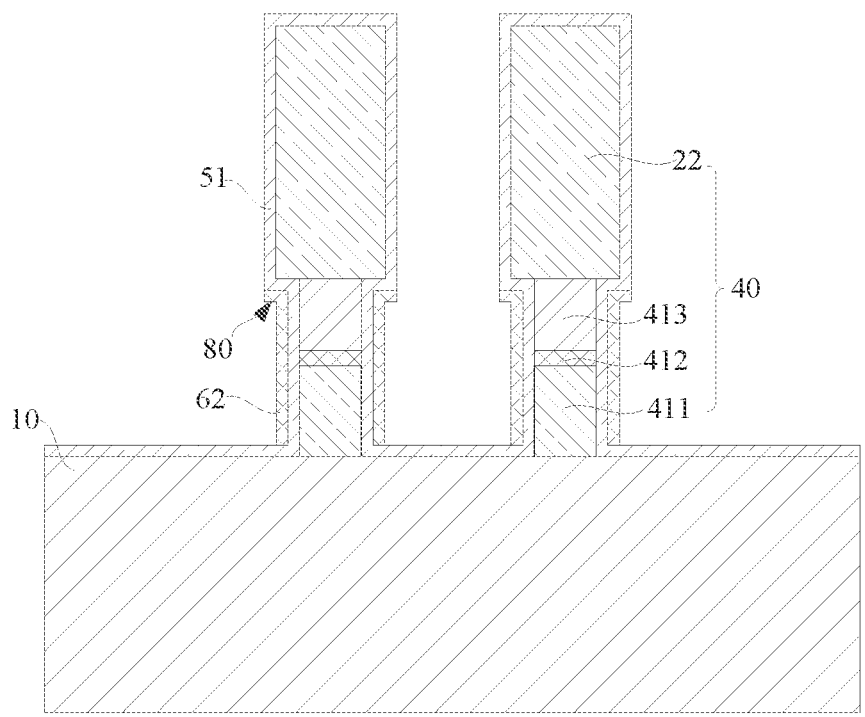
FIG. 9 is a schematic diagram of forming a second spacer in the method for fabricating the semiconductor structure according to an embodiment of the present disclosure.

Next, referring to FIG. 9, the second initial isolation layer 52 is removed by part of the thickness, and the second initial isolation layer 52 positioned between the adjacent bit lines 40 is removed by part of the thickness, and a retained part of the second initial isolation layer 52 constitutes the second isolation layer 62.

For example, the second initial isolation layer 52 positioned above the second stepped surface 80 and the second initial isolation layer 52 positioned between the adjacent bit lines 40 may be removed, such that the top surface of the second isolation layer 62 is lower than the first stepped surface, for example, the top surface of the second isolation layer 62 is flush with the second stepped surface 80. Based on such setting, the second isolation layer may be completely shielded by the first initial isolation layer 51 and the bit line insulating layer 22 positioned thereon, such that the second isolation layer is not damaged when the first initial isolation layer 51 and the third initial isolation layer 53 (referring to FIG. 10) positioned on the substrate 10 between the adjacent bit lines 40 are subsequently removed. In this embodiment, the total thickness of the first initial isolation layer 51 and the second isolation layer 62 is 1 to 5 nm. In this way, the fabrication of the second isolation layer 62 may be facilitated. Moreover, the second stepped surface 80 is maintained to prevent the subsequent process from causing damage to the second isolation layer 62.

In some possible examples, the second initial isolation layer 52 positioned above the second stepped surface 80 and the second initial isolation layer 521 positioned between the adjacent bit lines 40 may be removed by means of a third etching process. That is, the second initial isolation layer 52 on the first initial isolation layer 51 corresponding to the bit line insulating layer 22 is removed by means of the third etching process.

The third etching process includes the dry etching, and the etching gas of the third etching process is carbon tetrafluoride ($CF_4$). The volume flow rate of carbon tetrafluoride ($CF_4$) is 100 sccm to 300 sccm, and the etching selectivity of carbon tetrafluoride ($CF_4$) to the second initial isolation layer 52 is greater than the etching selectivity of carbon tetrafluoride ($CF_4$) to the first initial isolation layer 51. Based on such setting, only part of the second initial isolation layer 52 may be etched and removed, thereby reducing or avoiding the damage to the first initial isolation layer 51, and ensuring the insulation properties of the isolation spacer.

The bias voltage of the third etching process is 10 V to 100 V. Based on such setting, it may be ensured that the etching gas can be introduced along a direction perpendicular to the substrate 10. In this way, etching to the second initial isolation layer 52 positioned on the side wall of the bit line conductive layer 41 is weakened, and the second isolation layer 62 formed is shaped like an inverted L.

In addition, the bit line 40 is shaped like an inverted Chinese character "凸" which is wider at the top and narrower at the bottom, the wider bit line insulating layer 22 can protect the first initial isolation layer 51 and the second isolation layer 62 positioned on the narrower bit line conductive layer 41. In this case, no additional sacrificial layer is required to provide protection lest lateral etching is caused to the first initial isolation layer 51 and the second isolation layer 62. Even so, it still can ensure that when the initial isolation spacer 50 positioned on the substrate between the adjacent bit lines 40 is subsequently removed, no damage is caused to the first initial isolation layer 51 or the second isolation layer 62 positioned on the bit line conductive layer 41, such that the yield of the semiconductor structure is improved.

Figure 10:
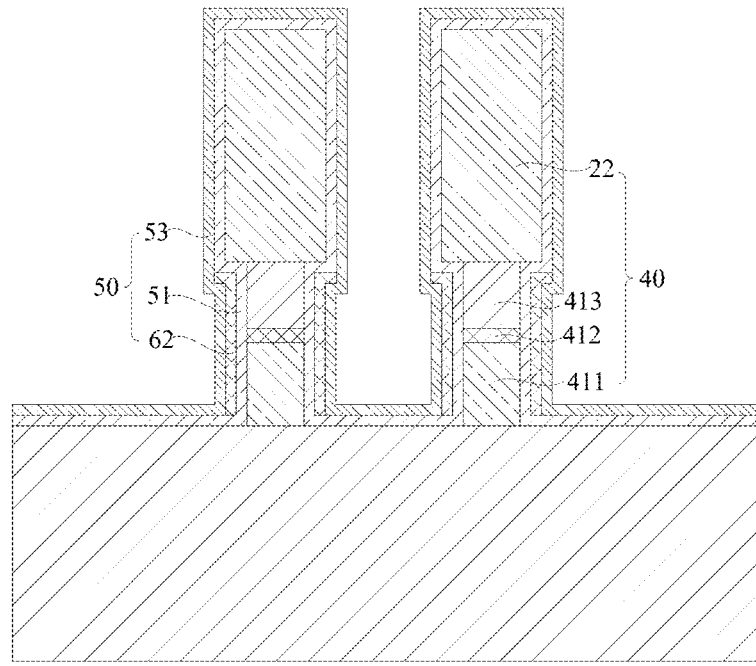
FIG. 10 is a schematic diagram of forming an initial isolation spacer in the method for fabricating the semiconductor structure according to an embodiment of the present disclosure.

Referring to FIG. 10, the third initial isolation layer 53 is formed by means of the atomic layer deposition process, and the third initial isolation layer 53 covers the second isolation layer 62 and the first initial isolation layer 51. A material of the third initial isolation layer 53 includes silicon nitride.

It should be noted that, in this embodiment, the initial isolation spacer is not limited to the above NON structure, and may also use other materials having a low dielectric constant.

Step S400: removing the initial isolation spacer positioned on the substrate between the adjacent bit lines, where a retained part of the initial isolation spacer constitutes an isolation spacer.

Figure 11:
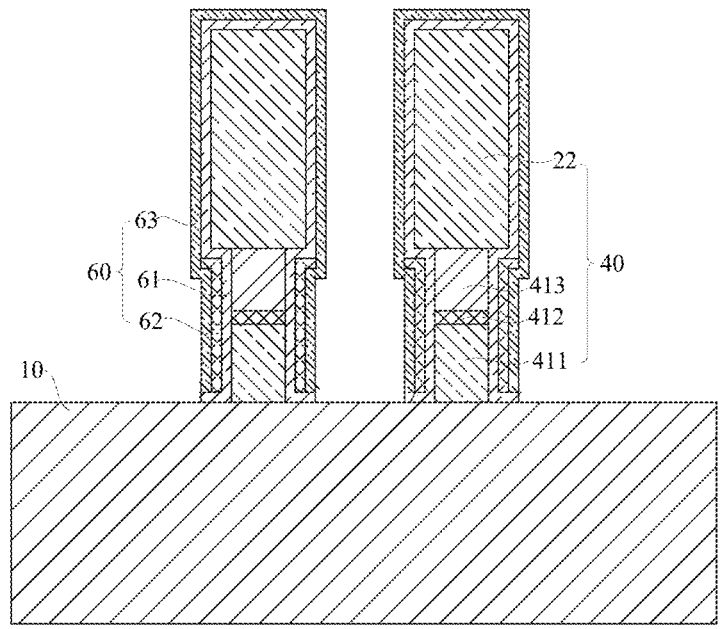
FIG. 11 is a schematic diagram of forming the initial isolation spacer in the method for fabricating the semiconductor structure according to an embodiment of the present disclosure.

Referring to FIG. 11, the first initial isolation layer 51 and the third initial isolation layer 53 on the substrate between the adjacent bit lines 40 may be removed by means of dry etching or wet etching, and a retained part of the first initial isolation layer 51 constitutes the first isolation layer 61, and a retained part of the third initial isolation layer 53 constitutes the third isolation layer 63.

That is, the isolation spacer 60 includes the first isolation layer 61, the second isolation layer 62 and the third isolation layer 63 arranged in stack, where the first isolation layer 61 covers the bit line 40, the second isolation layer 62 is positioned between the first isolation layer 61 and the third isolation layer 63, and the top surface of the second isolation layer 62 is lower than the top surface of the first isolation layer 61. For example, the top surface of the second isolation layer 62 is lower than the first stepped surface 70.

In this embodiment, when the first initial isolation layer and the third initial isolation layer positioned on the substrate between the adjacent bit lines are removed, the wider bit line insulating layer can protect the first initial isolation layer and the second isolation layer positioned on the narrower bit line conductive layer. In this case, even though there is no additional sacrificial layer required to provide protection, it still can ensure that when the initial isolation spacer positioned on the substrate between the adjacent bit lines is subsequently removed, no damage is caused to the first initial isolation layer or the second isolation layer positioned on the bit line conductive layer, such that the yield of the semiconductor structure is improved.

Figure 12:
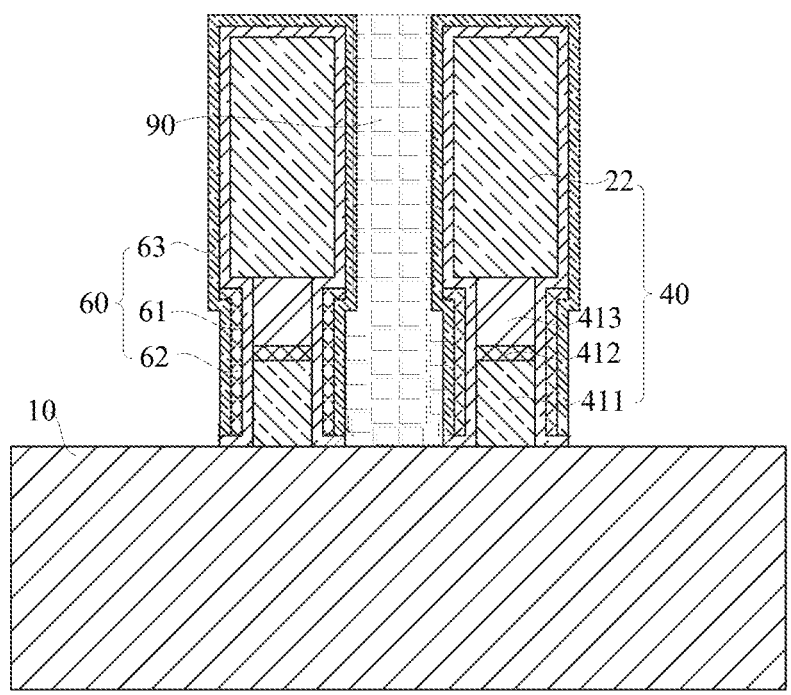
FIG. 12 is a schematic diagram of forming a capacitor contact structure in the method for fabricating the semiconductor structure according to an embodiment of the present disclosure.

Referring to FIG. 12, after the isolation spacer 60 is formed, the method for fabricating the semiconductor structure further includes: forming a plurality of capacitor contact structures 90, where the plurality of capacitor contact structures 90 are arranged in one-to-one correspondence with the bit lines 40, and each of the capacitor contact structures 90 is positioned between adjacent bit lines 40 and is insulated from the bit lines 40.

The embodiments of the present disclosure also provide a semiconductor structure, which is fabricated by means of the above method for fabricating the semiconductor structure in the above-mentioned embodiments.

With continued reference to FIG. 12, the semiconductor structure includes the substrate 10, the plurality of bit lines 40, and the plurality of isolation spacers 60. The plurality of bit lines 40 are disposed on the substrate 10 at intervals along the first direction, and are electrically connected to the active areas in the substrate 10. The width of the top of the bit line 40 is greater than the width of the bottom of the bit lines 40, such that the bit line has the first stepped surface 70. For example, the bit line 40 includes a bit line conductive layer 41 and a bit line insulating layer 22 arranged in stack, where the width of the bit line insulating layer 22 is greater than that of the bit line conductive layer 41, such that the first stepped surface 70 is formed between the bit line insulating layer 22 and the bit line conductive layer 41.

The plurality of isolation spacers 60 are arranged in one-to-one correspondence with the plurality of bit lines 40, and one isolation spacer 60 is covered on one bit line 40, where each of the isolation spacers 60 includes a first isolation layer 61, a second isolation layer 62, and a third isolation layer 63. The first isolation layer 61 covers the bit line 40, the second isolation layer 62 is positioned between the first isolation layer 61 and the third isolation layer 63, and the top surface of the second isolation layer 62 is lower than that of the first isolation layer 61. For example, the top surface of the second isolation layer 62 is lower than the first stepped surface 70. That is, a section perpendicular to the substrate 10 is taken as a longitudinal section, and the longitudinal section of the second isolation layer 62 is shaped like an inverted L.

In this way, the second isolation layer 62 is surrounded by the first isolation layer 61 and the third isolation layer 63, such that the isolation spacer 60 has a dense structure. When the capacitor contact structure 90 is subsequently formed, even though a top structure of the bit line 40 is polished, the second isolation layer 62 is not exposed, such that the second isolation layer 62 is prevented from being removed by an etching solution, and thus a conductive material of the capacitor contact structure 90 is not deposited into the isolation spacer 60. In this way, an isolation function of the isolation spacer 60 can be guaranteed, and a parasitic capacitance can be prevented from being formed between the bit line 40 and the isolation spacer 60, such that the yield of the semiconductor structure can be improved.

The embodiments or the implementation manners in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure. The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
   providing a substrate;
   forming a plurality of bit lines arranged at intervals along a first direction on the substrate, a width of a top of each of the plurality of bit lines being greater than a width of a bottom of each of the plurality of bit lines;
   forming an initial isolation spacer covering each of the plurality of bit lines, the initial isolation spacer comprising a first initial isolation layer, a second isolation layer and a third initial isolation layer stacked, the first initial isolation layer covering the plurality of bit lines, the second isolation layer being positioned between the first initial isolation layer and the third initial isolation layer, and a top surface of the second isolation layer being lower than a top surface of the first initial isolation layer; and
   removing the initial isolation spacer positioned on the substrate between two adjacent ones of the plurality of bit lines, wherein a remaining portion of the initial isolation spacer forms an isolation spacer;
   wherein the forming the plurality of bit lines arranged at intervals along the first direction on the substrate comprises:
   forming a plurality of initial bit lines arranged at intervals along the first direction on the substrate, each of the plurality of initial bit lines comprising an initial bit line conductive layer and a bit line insulating layer stacked, and a width of the initial bit line conductive layer being equal to a width of the bit line insulating layer; and
   removing a portion of width of the initial bit line conductive layer along the first direction, a remaining part of the initial bit line conductive layer constituting a bit line conductive layer, and a first stepped surface being formed between the bit line conductive layer and the bit line insulating layer;
   wherein the initial bit line conductive layer comprises an initial contact layer, an initial barrier layer and an initial conductive layer sequentially stacked; and the removing a portion of width of the initial bit line conductive layer along the first direction comprises:
   removing a portion of width of each of the initial conductive layer and the initial barrier layer along the first direction by means of a first etching process, to form an intermediate conductive layer and an intermediate barrier layer stacked; and
   removing a portion of width of each of the intermediate conductive layer, the intermediate barrier layer, and the initial contact layer along the first direction by means of a second etching process, to form the plurality of bit lines;
   wherein the second etching process comprises dry etching, etching gases of the second etching process comprise chlorine gas and nitrogen trifluoride, and a ratio of the chlorine gas to the nitrogen trifluoride is 3:1 to 1:1.

2. The method for fabricating the semiconductor structure according to claim 1, wherein the first etching process is the same as the second etching process.

3. The method for fabricating the semiconductor structure according to claim 1, wherein the first etching process comprises dry etching, etching gases of the first etching process comprise chlorine gas and carbon tetrafluoride, and a ratio of the chlorine gas to the carbon tetrafluoride is 1:2 to 1:4.

4. The method for fabricating the semiconductor structure according to claim 3, wherein a volume flow rate of the chlorine gas is 25 sccm to 35 sccm, and a volume flow rate of the carbon tetrafluoride is 90 sccm to 110 sccm.

5. The method for fabricating the semiconductor structure according to claim 3, wherein etching time of the first etching process is 10 s to 30 s; and a bias voltage of the first etching process is 0 V.

6. The method for fabricating the semiconductor structure according to claim 1, wherein a volume flow rate of the chlorine gas is 15 sccm to 25 sccm, and a volume flow rate of the nitrogen trifluoride is 5 sccm to 15 sccm.

7. The method for fabricating the semiconductor structure according to claim 1, wherein etching time of the second etching process is 10 s to 20 s; and a bias voltage of the second etching process is 0 V.

8. The method for fabricating the semiconductor structure according to claim 1, wherein the forming an initial isolation spacer covering each of the plurality of bit lines comprises:
- forming the first initial isolation layer, the first initial isolation layer wrapping the plurality of bit lines and covering the substrate positioned between adjacent two of the plurality of bit lines, wherein the first initial isolation layer forms a second stepped surface on the first stepped surface;
- forming the second initial isolation layer, the second initial isolation layer covering the first initial isolation layer;
- removing the second initial isolation layer by part of a thickness and the second initial isolation layer positioned between adjacent two of the plurality of bit lines, a remaining part of the second initial isolation layer constituting the second isolation layer, and the top surface of the second isolation layer being lower than the top surface of the first initial isolation layer; and
- forming the third initial isolation layer, the third initial isolation layer covering the second isolation layer and the first initial isolation layer.

9. The method for fabricating the semiconductor structure according to claim 8, wherein the removing the second initial isolation layer by part of the thickness comprises:
- removing the second initial isolation layer positioned above the second stepped surface and the second initial isolation layer positioned between adjacent two of the plurality of bit lines by means of a third etching process, such that the top surface of the second isolation layer formed is flush with the second stepped surface.

10. The method for fabricating the semiconductor structure according to claim 9, wherein the third etching process comprises dry etching, and an etching gas of the third etching process comprises carbon tetrafluoride; and
- a volume flow rate of the carbon tetrafluoride is 100 sccm to 300 sccm; and a bias voltage of the third etching process is 10 V to 100 V.

11. A semiconductor structure, the semiconductor structure being fabricated by means of the method for fabricating the semiconductor structure according to claim 1, the semiconductor structure comprising:
- the substrate;
- the plurality of bit lines, the plurality of bit lines being arranged at intervals along the first direction, and the width of the top of each of the plurality of bit lines being greater than the width of the bottom of each of the plurality of bit lines, such that each of the plurality of bit lines has a first stepped surface; and
- the isolation spacer covering each of the plurality of bit lines, wherein the isolation spacer comprises a first isolation layer, the second isolation layer and a third isolation layer stacked, the first isolation layer covering the plurality of bit lines, the second isolation layer being positioned between the first isolation layer and the third isolation layer, and the top surface of the second isolation layer being lower than a top surface of the first isolation layer.

12. The semiconductor structure according to claim 11, wherein the top surface of the second isolation layer is lower than the first stepped surface, and a section perpendicular to the substrate is taken as a longitudinal section, the longitudinal section of the second isolation layer being shaped like an inverted L.

* * * * *